(12) United States Patent
Sater

(10) Patent No.: US 8,106,293 B2
(45) Date of Patent: Jan. 31, 2012

(54) PHOTOVOLTAIC CELL WITH BUFFER ZONE

(75) Inventor: Bernard L. Sater, Strongsville, OH (US)

(73) Assignee: MH Solar Co., Ltd., Taipei (TW)

( * ) Notice: Subject to any disclaimer, the term of this patent is extended or adjusted under 35 U.S.C. 154(b) by 194 days.

(21) Appl. No.: 12/536,987

(22) Filed: Aug. 6, 2009

(65) Prior Publication Data

US 2010/0037944 A1     Feb. 18, 2010

Related U.S. Application Data

(60) Provisional application No. 61/088,936, filed on Aug. 14, 2008.

(51) Int. Cl.
*H01L 31/042* (2006.01)
(52) U.S. Cl. ............. 136/261; 136/256; 438/66; 438/64
(58) Field of Classification Search .................. 136/255, 136/256, 261; 438/57
See application file for complete search history.

(56) References Cited

U.S. PATENT DOCUMENTS

| 4,021,323 A | 5/1977 | Kilby et al. |
| 4,046,594 A | 9/1977 | Tarui et al. |
| 4,082,570 A | 4/1978 | House et al. |
| 4,193,081 A | 3/1980 | Kaplow et al. |
| 4,272,641 A | 6/1981 | Hanak |
| 4,332,973 A | 6/1982 | Sater |
| 4,381,233 A | 4/1983 | Adachi et al. |
| 4,409,422 A | 10/1983 | Sater |
| 4,516,314 A * | 5/1985 | Sater .............................. 438/67 |
| 4,516,317 A | 5/1985 | Bailey |
| 4,634,641 A | 1/1987 | Nozik |
| 4,643,817 A | 2/1987 | Appleby |
| 4,714,510 A | 12/1987 | Holt |
| 4,996,577 A | 2/1991 | Kinzer |
| 5,057,163 A | 10/1991 | Barnett et al. |
| 5,067,985 A | 11/1991 | Carver et al. |
| 5,244,509 A | 9/1993 | Arao et al. |
| 5,261,969 A | 11/1993 | Stanbery |
| 5,437,734 A | 8/1995 | Matsushita et al. |
| 5,667,597 A | 9/1997 | Ishihara |
| 5,716,459 A | 2/1998 | Chang et al. |
| 5,871,591 A | 2/1999 | Ruby et al. |
| 6,028,327 A | 2/2000 | Mizoguchi et al. |
| 6,583,350 B1 | 6/2003 | Gee et al. |
| 2002/0100836 A1 | 8/2002 | Hunt |

(Continued)

OTHER PUBLICATIONS

Guo, et al. Edge Passivation for Small-Area, High-Efficiency Solar Cells. 22nd European Photovoltaic Solar Energy Conference, Sep. 3-7, 2007, pp. 1348-1351.

(Continued)

*Primary Examiner* — Jennifer Michener
*Assistant Examiner* — Jayne Mershon
(74) *Attorney, Agent, or Firm* — Turocy & Watson, LLP

(57) ABSTRACT

Systems and methods that provide a barrier for protection of active layers associated with a vertical multi junction (VMJ) photovoltaic cell. Buffer zone(s) in form of an inactive layer (s) arrangement safe guard the active layers against induced stress or strain resulting from external forces/thermal factors (e.g., welding). The buffer zone can be in form of a rim on a surface of an end layer of a cell unit, to act as a protective boundary for such active layer, and to further partially frame the VMJ cell for ease of handling and transportation.

20 Claims, 5 Drawing Sheets

U.S. PATENT DOCUMENTS

| | | |
|---|---|---|
| 2003/0015700 A1 | 1/2003 | Eisenbeiser et al. |
| 2004/0200523 A1 | 10/2004 | King et al. |
| 2004/0261840 A1 | 12/2004 | Schmit et al. |
| 2004/0262154 A1 | 12/2004 | Gibson et al. |
| 2005/0176164 A1 | 8/2005 | Gee et al. |
| 2005/0211290 A1 | 9/2005 | Deng et al. |
| 2006/0021565 A1 | 2/2006 | Zahler et al. |
| 2007/0151599 A1 | 7/2007 | Cousins |
| 2008/0017243 A1 | 1/2008 | De Ceuster et al. |
| 2008/0048102 A1 | 2/2008 | Kurtz |
| 2008/0173349 A1 | 7/2008 | Liu et al. |

OTHER PUBLICATIONS

Written Opinion and International Search Report Mailed Jan. 8, 2010 for Application No. PCT/US 09/053576, 21 pages.

Sater, et al. High Voltage Silicon VMJ Solar Cells for up to 1000 Suns Intensities. Photovoltaic Specialists Conference 2002. Conference Record of the Twenty-Ninth IEEE, May 19-24, 2002, pp. 1019-1022. Last accessed Oct. 1, 2009, 4 pages.

Bifacial concentration on VMJ cell. http://www.ioserver.com/fresnelx/vmj.htm. Last accessed Nov. 14, 2009, 3 pages.

Overview of "The eeeIlluminator Conference" http://www.e3energy.org/vol2no4.pdf. Last accessed Nov. 17, 2009, 9 pages.

Miller et al. "Design Considerations for a Hybrid Amorphous SiliconlPhotoelectrochemical Multijunction Cell for Hydrogen Production" http://www.hnei.hawaii.edu/docs/PEC/ICAM_2001.pdf. Last accessed Nov. 17, 2009, 11 pages.

Hovel. "Novel Materials and Devices for Sunlight Concentrating Systems," IBM J. Res Develop, pp. 112-121, vol. 22, No. 2 (1978).

Geisz, et al. In situ Stress Measurement for MOVPE Growth of High Efficiency Lattice-mismatched Solar Cells.

Office Action dated Feb. 17, 2011 for U.S. Appl. No. 12/536,982, 25 pages.

Office Action dated May 27, 2011 for U.S. Appl. No. 12/535,952, 21 pages.

Office Action dated Nov. 9, 2011 for U.S. Appl. No. 12/535,952, 18 pages.

Office Action dated Nov. 3, 2011 for U.S. Appl. No. 12/536,992, 26 pages.

Office Action dated Aug. 25, 2011 for U.S. Appl. No. 12/536,982, 19 pages.

* cited by examiner

PHOTOVOLTAIC CELL WITH BUFFER ZONE

CROSS REFERENCE TO RELATED APPLICATIONS

This application claims the benefit of U.S. Provisional Application No. 61/088,936 filed on 14 Aug. 2008 entitled "SOLAR CELL WITH BUFFER ZONE" the entirety of this application is hereby incorporated by reference.

BACKGROUND

Limited supply of fossil energy resources and their associated global environmental damage have compelled market forces to diversify energy resources and related technologies. One such resource that has received significant attention is solar energy, which employs photovoltaic systems to convert light into electricity. Typically, photovoltaic production has been doubling every two years, increasing by an average of 48 percent each year since year 2002, making it the world's fastest-growing energy technology. By midyear 2008, estimates for cumulative global solar energy production stands to at least 12,400 megawatts.

Accordingly, solar concentrators represent promising approaches for mitigating costs associated with photovoltaic (PV) cells. In general, PV concentrators employ low cost materials such as large area glass mirrors to intensify sunlight, and reduce amount of required semiconductor material deemed expensive. In effect, PV concentrators can reduce a dollar-to-watt cost barrier, which typically impedes conventional PV Industry. Moreover, PV concentrators can provide performance advantages, as high cell efficiencies and sun tracking become prevalent.

A significant challenge to achieve increased cost effectiveness is enabling silicon photovoltaic cells to operate efficiently at high intensities while maintaining relatively low manufacturing costs. To meet such challenge, high voltage silicon vertical multi-junction (VMJ) photovoltaic cells have been proposed as an attractive solution. Nonetheless, active layers positioned at ends of such cells are susceptible to damage. In addition, such end layers are more susceptible to mechanical stress caused during manufacturing, and/or to thermal stress induced during high intensity operation resulting from a mismatch of thermal expansion coefficients of contact metals applied thereto (e.g., as electrical leads.) For example, welding of metal contacts to such end layers can adversely affect properties of the active layers, and hence degrade over all performance of the cell. Similarly, intrinsic mechanical stress induced during such fabrication can negatively affect behavior for adjacent underlying diffused junctions.

Likewise, problems can arise due to stress from thermal cycling in high intensity operation, which is caused by differential thermal expansion coefficients of the electrical leads. Such thermal expansion mismatch can further induce thermal strain, which can also affect the underlying active junctions, and degrade overall cell performance or threaten the long-term structural integrity of the VMJ cell.

Such problems are further compounded in cell arrays, wherein a plurality of VMJ cells are connected in series (e.g., via lead contacts), and the poorest performing cell limits operations of the overall array.

SUMMARY

The following presents a simplified summary in order to provide a basic understanding of some aspects of the claimed subject matter. This summary is not an extensive overview. It is not intended to identify key/critical elements or to delineate the scope of the claimed subject matter. Its sole purpose is to present some concepts in a simplified form as a prelude to the more detailed description that is presented later.

The subject innovation supplies a buffer zone(s) at end layers of a high voltage silicon vertical multi junction (VMJ) photovoltaic cell, to provide a barrier that protects the active layers while providing an ohmic contact. Such buffer zone(s) can be in form of an inactive layer(s) arrangement that is additionally stacked upon and/or below end layers of the VMJ cell. The VMJ cell itself can include a plurality of cell units, wherein each cell unit employs several active layers (e.g., three) to form a PN junction and a "built-in" electrostatic drift field (which enhances minority carrier movement toward the PN junction.)

As such, various active layers such as nn+ and/or p+n junctions located at either ends of a VMJ cell (and as part of cell units thereof) can be safeguarded against adverse forms of stress and/or strain (e.g., thermal/mechanical compression, torsion, moment, shear and the like—which can be induced in the VMJ during fabrication and/or operation thereof.) Moreover, the buffer zone can be formed via materials that have substantially low resistivity ohmic contact, either metals or semiconductors, such that it will not contribute any substantial series resistance loss in the photovoltaic cell at operating conditions. For example, the buffer zone can be formed by employing low resistivity silicon wafers that are p-type doped, so that when using other p-type dopants such as aluminum alloys in manufacturing the VMJ photovoltaic cell, it will mitigate a risk of auto-doping (in contrast to employing n-type wafers that can create unwanted pn junctions—when an object is to create a substantially low resistivity ohmic contact. It is to be appreciated that the subject innovation can be implemented as part of any class of photovoltaic cells such as solar cells or thermophotovoltaic cells. Additionally, aspects of the subject innovation also can be implemented in other class(es) of energy-conversion cells such as betavoltaic cells.

In related aspects, the buffer zone can be in form of a rim on a surface of an end layer of a cell unit, which acts as a protective boundary for such active layer and further frames the VMJ cell for ease of handling and transportation. Likewise, by enabling a secure grip to the VMJ cell, such rim formation also eases operation related to the anti reflective coating (e.g., coating can be applied uniformly when the cell is securely maintained during operation, such as by mechanically clamping thereon.) Moreover, the buffer zones (e.g., the inactive layers positioned at ends of the VMJ) can be physically positioned adjacent to other buffer zones during the deposition—and hence any unwanted dielectric coating material that inadvertently penetrates down onto the contact surfaces can be readily removed without damaging active unit cells. The buffer zone can be formed from substantially low resistivity and highly doped silicon (e.g., a thickness of approximately 0.008") Such buffer zone can subsequently contact conductive leads that partition or separate a VMJ cell from another VMJ cell in a photovoltaic cell array.

According to a further aspect, the buffer zone can be sandwiched between an electrical contact, and the active layers of the VMJ cells. Moreover, such buffer zones can have thermal expansion characteristics that substantially match those of the active layers, hence mitigating performance degradation (e.g., mitigation of stress/strain caused when leads are welded or soldered in manufacturing.) For example, highly doped low resistivity silicon layers can be employed, which match the thermal expansion coefficient ($3 \times 10^{-6}/°$ C.) of all active unit cells. Accordingly, substantially strong ohmic contacts can be provided to the active unit cells, which additionally mitigate stress problems caused by welding/soldering and/or from mismatched thermal expansion coefficients in contact materials. Other examples include introducing metallic layers, such as tungsten ($4.5 \times 10^{-6}/°$ C.), or molybdenum ($5.3 \times 10^{-6}/°$ C.), which are chosen for thermal expansion coefficients substantially similar to the active silicon ($3 \times 10^{-6}/°$ C.) p+nn+ unit cells. The metallization applied to the outer layers of the low resistivity silicon layers of the buffer zone, or to the metallic layers of electrodes that are alloyed to the active unit cells, can be welded or soldered without introducing deleterious stress to the high intensity solar cell or photovoltaic cell—wherein such outer layers serve as ohmic contacts; rather than segments of unit cells in series with the other unit cells.

Various aspect of the subject innovation can be implemented as part of wafers having miller indices (111) for orientation of associated crystal planes of the buffer zones, which are considered mechanically stronger and slower etching than (100) crystal orientation silicon typically used in making active VMJ unit cells. Accordingly, low resistivity silicon layers can have a different crystal orientation than that of the active unit cells, wherein by employing such alternative orientation, a device with improved mechanical strength/end contacts is provided. Put differently, edges of (100) orientated unit cells typically etch faster and essentially round off corners of the active unit cells with such crystal orientation—as compared to the inactive (111) orientated end layers—hence resulting in a more stable device structure with higher mechanical strength for welding or otherwise connecting end contacts.

To the accomplishment of the foregoing and related ends, certain illustrative aspects (not to scale) of the claimed subject matter are described herein in connection with the following description and the annexed drawings. These aspects are indicative of various ways in which the subject matter may be practiced, all of which are intended to be within the scope of the claimed subject matter. Other advantages and novel features may become apparent from the following detailed description when considered in conjunction with the drawings.

DETAILED DESCRIPTION

The various aspects of the subject innovation are now described with reference to the annexed drawings, wherein like numerals refer to like or corresponding elements throughout. It should be understood, however, that the drawings and detailed description relating thereto are not intended to limit the claimed subject matter to the particular form disclosed. Rather, the intention is to cover all modifications, equivalents, and alternatives falling within the spirit and scope of the claimed subject matter.

Figure 1:
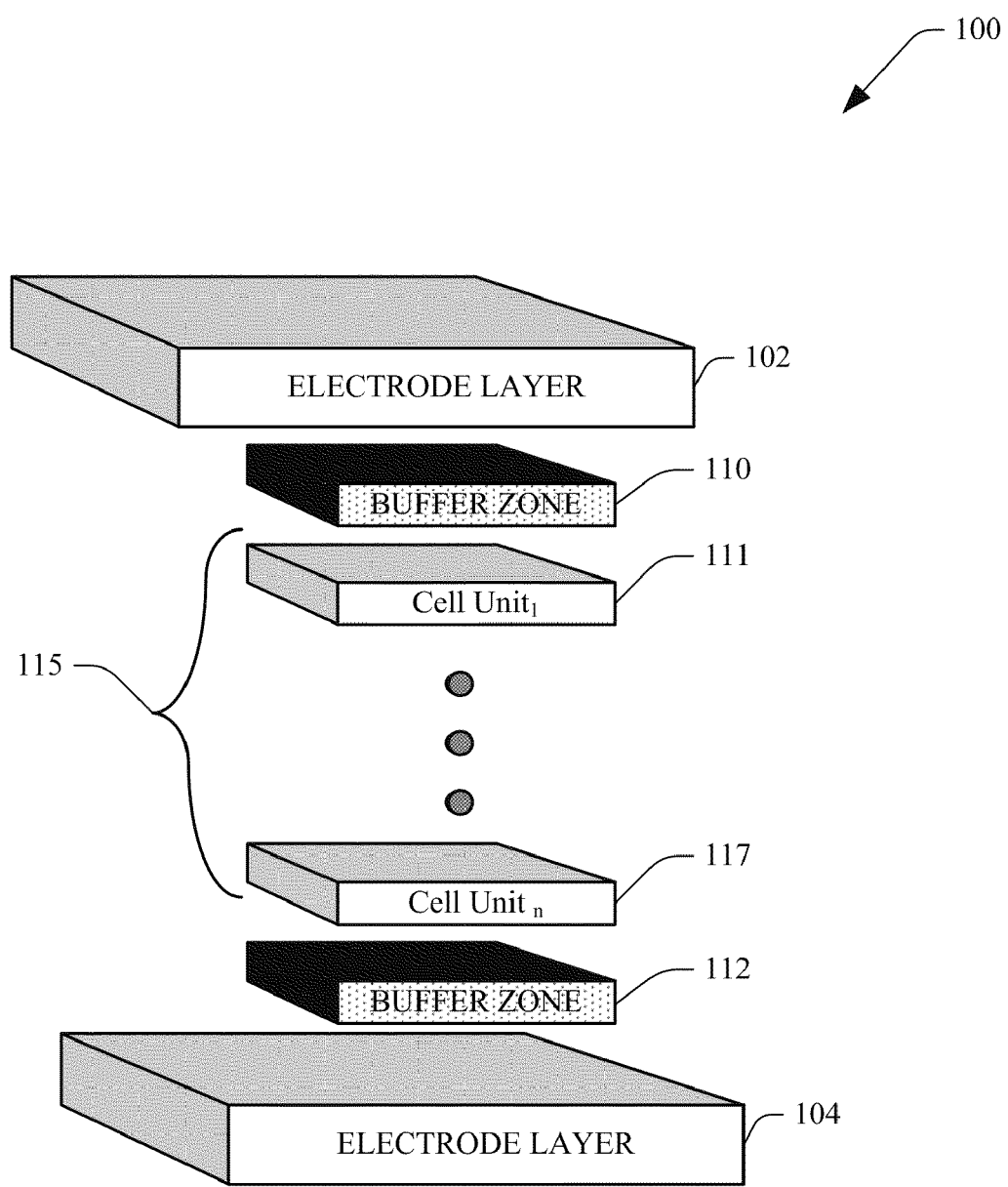
FIG. 1 illustrates a schematic block diagram of an arrangement for buffer zones as part of a vertical multi junction (VMJ) cell in accordance with an aspect of the subject innovation.

FIG. 1 illustrates a schematic block diagram of an arrangement for buffer zones as part of vertical multi junction (VMJ) cell in accordance with an aspect of the subject innovation. The VMJ 115 itself is formed from a plurality of integrally bonded cell units 111, 117 (1 to n, n being an integer), wherein each cell unit itself is formed from stacked substrates or layers (not shown). For example, each cell unit 111, 117 can include a plurality of parallel semiconductor substrates stacked together, and consisting of impurity doped semiconductor material, which form a PN junction and a "built-in" electrostatic drift field that enhance minority carrier movement toward such PN junction. Accordingly, various active layers such as nn+ and/or p+n junctions, or pp+ and/or pn+ junctions, located at either ends of a VMJ cell 115 (and as part of cell units thereof) can be safeguarded against adverse forms of stress and/or strain (e.g., thermal/mechanical compression, torsion, moment, shear and the like—which can be induced in the VMJ during fabrication and/or operation thereof.)

Moreover, each of the buffer zones 110 112 can be formed via material that have substantially low resistivity ohmic contact (e.g., any range with upper limit less than approximately 0.5 ohm-cm), while mitigating and/or eliminating unwanted auto doping. For example, the buffer zones 110, 112 can be formed by employing low resistivity wafers that are p-type doped, with other p-type dopants such as aluminum alloys, to mitigate a risk of auto-doping (in contrast to employing n-type wafers that can create unwanted pn junctions—when it is desired to create a substantially low resistivity ohmic contact.)

Figure 2:
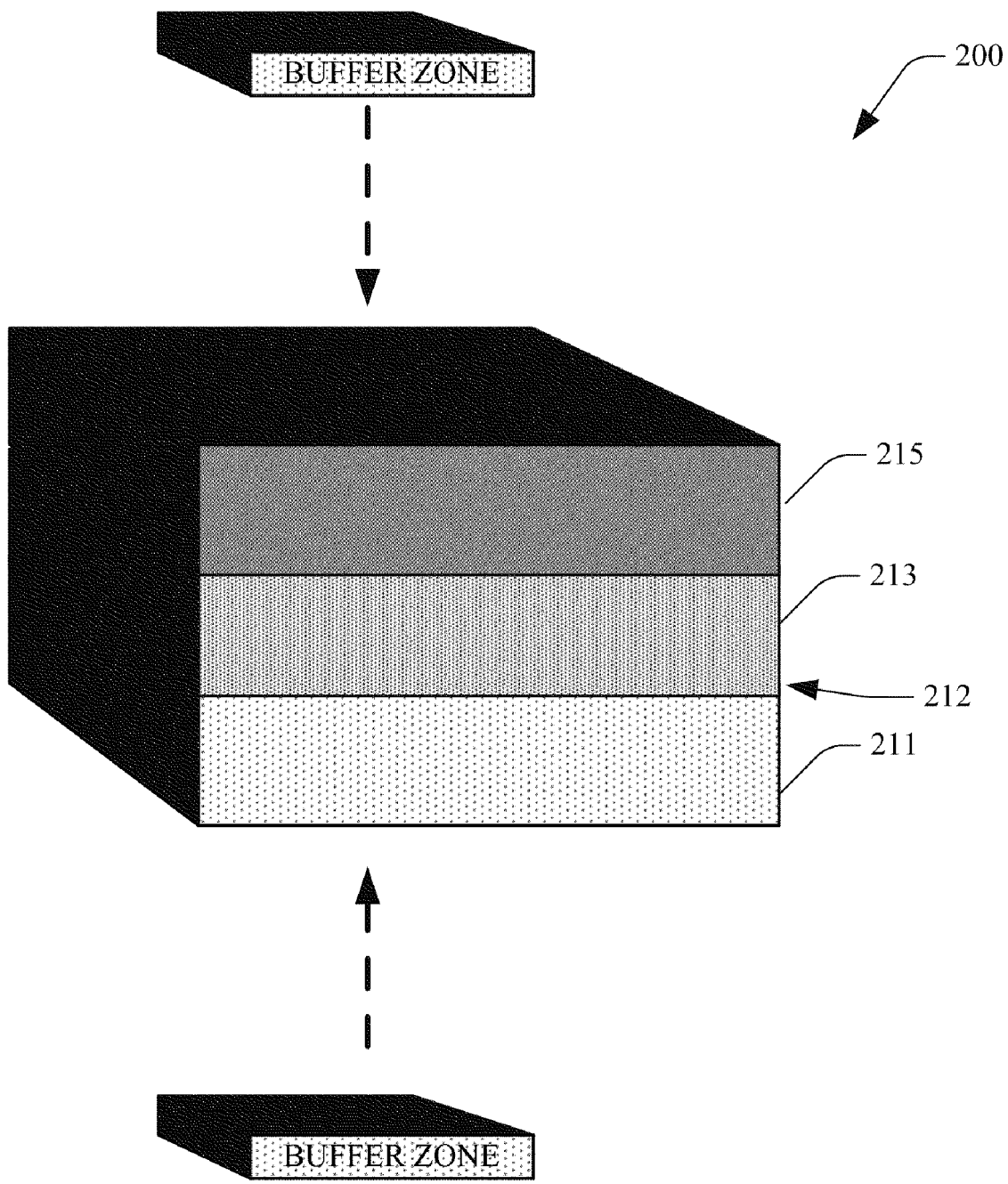
FIG. 2 illustrates a particular aspect of a unit cell, an array of which can from a VMJ cell in accordance with a particular aspect of the subject innovation.

FIG. 2 illustrates a particular aspect of a unit cell, an array of which can form a VMJ cell. The unit cell 200 includes layers 211, 213, 215 stacked together in a substantially parallel arrangement. Such layers 211, 213, 215 can further include impurity doped semiconductor material, wherein layer 213 is of one conductivity type and layer 211 is of an opposing conductivity type—to define a PN junction at intersection 212. Likewise, layer 215 can be of the same conductivity type as layer 213-yet with substantially higher impurity concentration, hence generating a built-in electrostatic drift field that enhances minority carrier movements toward the PN junction 212. Such unit cells can be integrally bonded together to form a VMJ, wherein a buffer zone of the subject innovation can be positioned to safe guard the VMJ and associated unit cells and/or layers that form them.

According to a further aspect, to fabricate the VMJ from a plurality of cells 200, initially identical PNN+ (or NPP+) junctions can be formed to a depth of approximately 3 to 10 μm into flat wafers of high resistivity (e.g., more than 100 ohm-cm) of N type (or P type) silicon—having a thickness of approximately 0.008 inch. Subsequently, such PNN+ wafers are stacked together with a thin layer of aluminum interposed between each wafer, wherein each wafer's PNN+ junction and crystal orientation can be oriented in the same direction. Moreover, aluminum-silicon eutectic alloys can be employed, or metals such as molybdenum or tungsten with thermal coefficient(s) that substantially matches the thermal coefficient of silicon. Next, the silicon wafers and aluminum interfaces can be alloyed together, such that the stacked assembly can be bonded together. Moreover, aluminum-silicon eutectic alloys can also be employed. It is to be appreciated that various N+-type and P-type doping layers can be implemented as part of the cell units and such arrangements are well within the realm of the subject innovation.

Buffer zones with substantially low resistivity can also be supplied in form of an inactive layer(s) arrangement that is additionally stacked upon and/or below end layers of the VMJ cell—hence implementing a barrier that protects the active layers against adverse forms of stress and/or strain (e.g., thermal/mechanical compression, torsion, moment, shear and the like—which can be induced in the VMJ during fabrication and/or operation thereof.)

Figure 3:
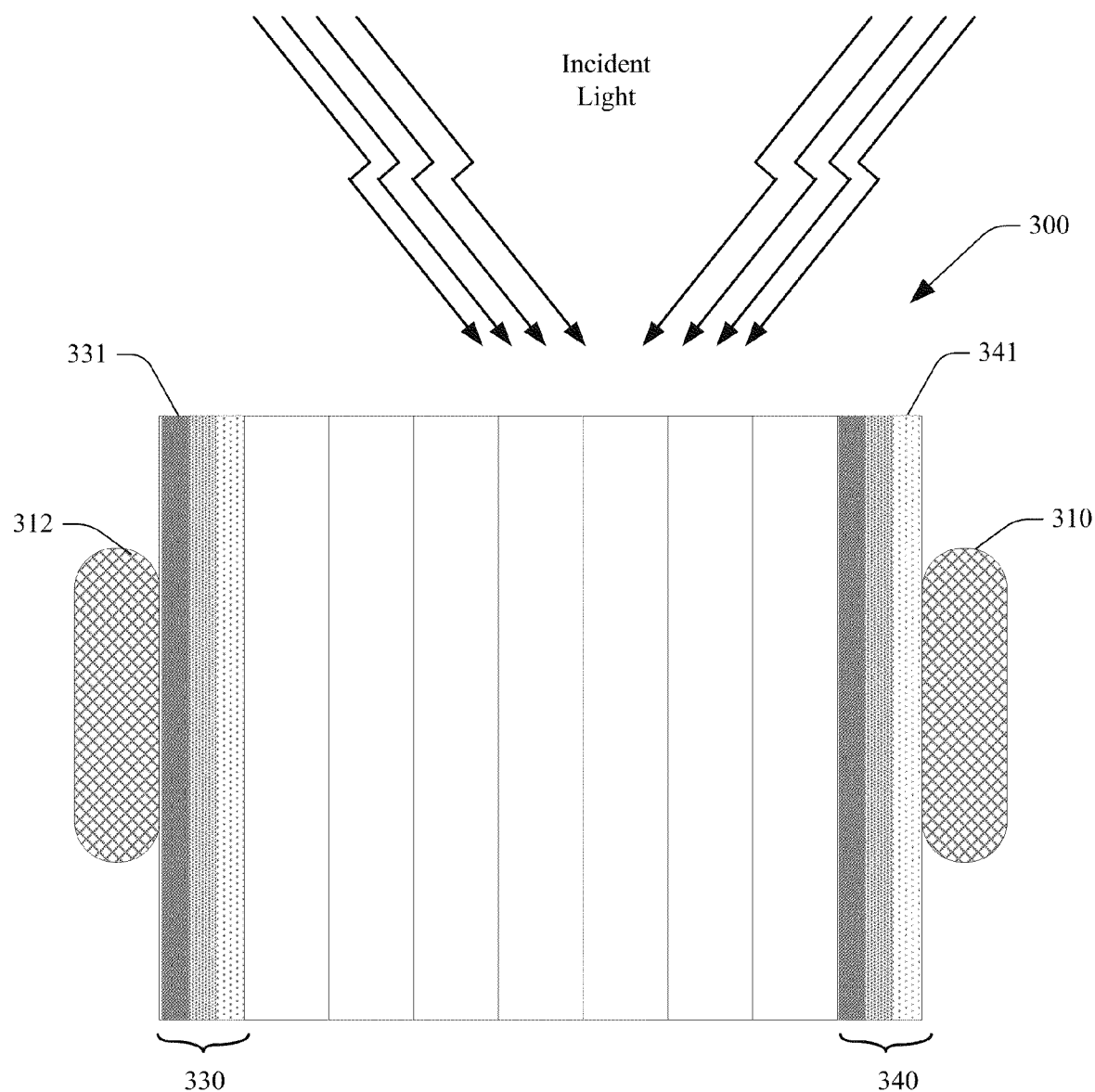
FIG. 3 illustrates an exemplary cross section for a buffer zone in form of a rim formation on surfaces of unit cells located at either end of a VMJ.

FIG. 3 illustrates an exemplary cross section for a buffer zone in form of a rim formation 310 (312) on surfaces of an end layer 331 (341) of unit cells 330 (340), which in part forms the VMJ cell 300. Such rim formations 310, 312 act as a protective boundary for active layers of the cell units, and further partially frame the VMJ cell 300 for ease of handling and transportation (e.g., a low resistivity buffer zone and edge or end contact of the VMJ cell.) Likewise, by enabling a secure grip to the VMJ cell 300, the rim formation also eases operation related to the anti reflective coating (e.g., coating can be applied uniformly when the cell is securely maintained during operation, such as by mechanically clamping thereon.) Moreover, such rim formations can physically be positioned adjacent to other rim formations during the deposition process, wherein any unwanted dielectric coating material that inadvertently penetrates down onto the contact surfaces can be readily removed without damaging the unit cells 330, 340. The rim formation 310 (312) representing the buffer zone can be formed from substantially low resistivity and highly doped silicon (e.g., a thickness of approximately 0.008"), wherein the rim formation can subsequently contact conductive leads that partition a VMJ cell from another VMJ cell in a photovoltaic cell array. Moreover, because of the substantially low resistivity of the buffer zone, the conductive leads are not required to have full electrical contact to the buffer zone. As such, they can be partial contacts, such as a point contact, or a series of point contacts, while nevertheless providing good electrical contact. It is to be appreciated that FIG. 3 is exemplary in nature, and other variations—such as the buffer zone 310 formed in manufacturing reaching the surfaces of 300 with 310 bonding to active layers 341—are well within the realm of the subject innovation. For example, the shape of 310 can represent a partial lead contact to the metalized layer on the buffer zone as discussed earlier.

The conductive leads can be in form of electrode layers, which are formed by depositing a first conductive material on a substrate—and can comprise; tungsten, silver, copper, titanium, chromium, cobalt, tantalum, germanium, gold, aluminum, magnesium, manganese, indium, iron, nickel, palladium, platinum, zinc, alloys thereof, indium-tin oxide, other conductive and semiconducting metal oxides, nitrides and silicides, polysilicon, doped amorphous silicon, and various metal composition alloys. In addition, other doped or undoped conducting or semi-conducting polymers, oligomers or monomers, such as PEDOT/PSS, polyaniline, polythiothene, polypyrrole, their derivatives, and the like can be employed for electrodes. Furthermore, since some metals can have a layer of oxide formed thereupon that can adversely affect the performance of the VMJ cell, non-metal material such as amorphous carbon can also be employed for electrode formation. It is to be appreciated that the rim formation of FIG. 3 is exemplary in nature and other configurations for the buffer zone such as, rectangular, circular, cross sections having a range of surface contact with the active layers are well within the realm of the subject innovation.

Moreover, various aspect of the subject innovation can be implemented as part of wafers having miller indices (111) for orientation of associated crystal planes of the buffer zones, which are considered mechanically stronger and slower etching than (100) crystal orientation silicon typically used in fabricating active VMJ unit cells. Accordingly, low resistivity silicon layers can have a different crystal orientation than that of the active unit cells, wherein by employing such alternative orientation, a device with improved mechanical strength/end contacts is provided. Put differently, edges of (100) orientated unit cells typically etch faster to essentially round off corners of the active unit cells with such crystal orientation—as compared to the inactive (111) orientated end layers, hence resulting in a more stable device structure with higher mechanical strength for welding or otherwise connecting end contacts.

Figure 4:
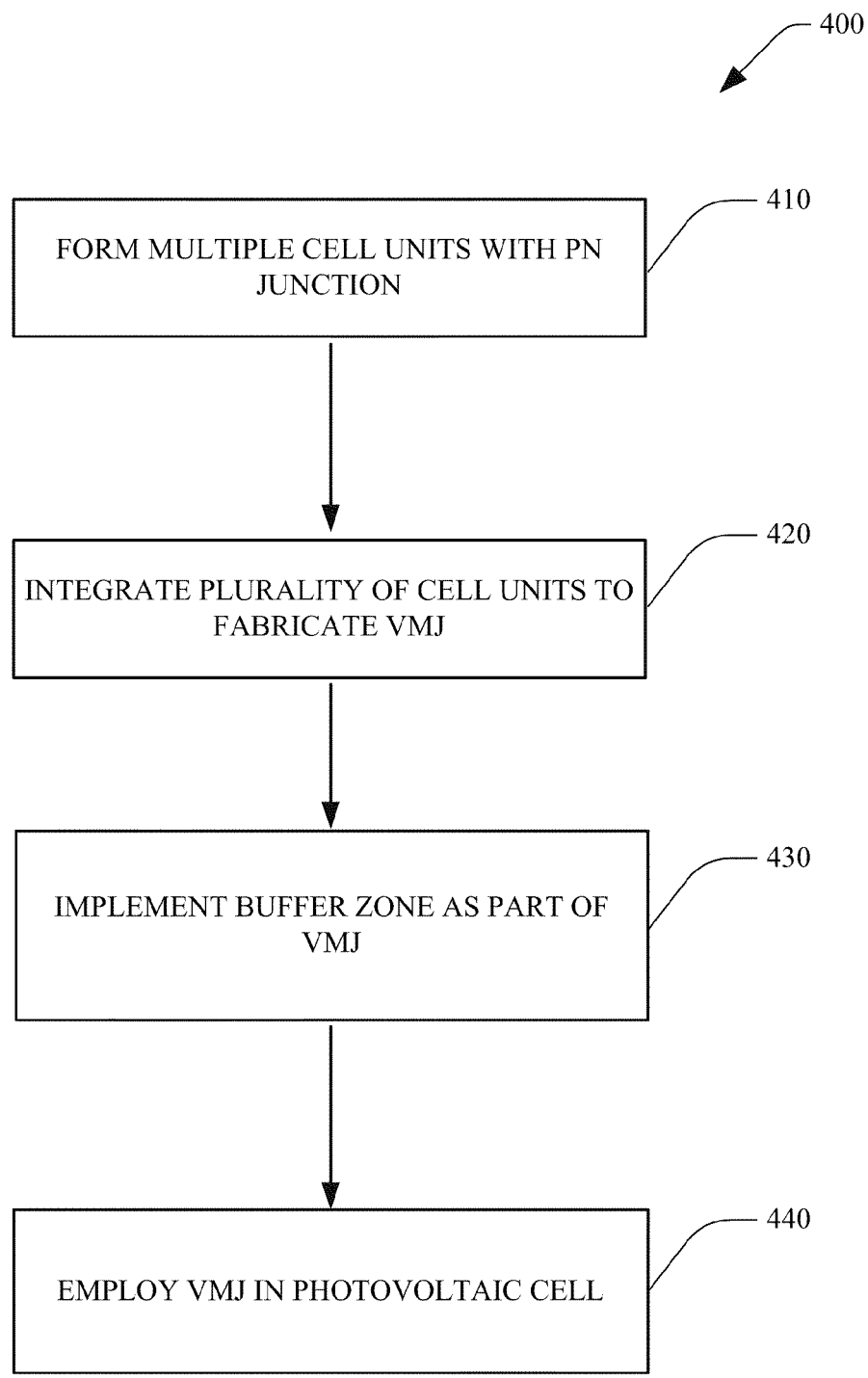
FIG. 4 illustrates a related methodology of employing buffer zones at end layers of a high voltage silicon vertical multi junction (VMJ) photovoltaic cell, to provide a barrier that protects the active layers thereof.

FIG. 4 illustrates a related methodology 400 of employing buffer zones at end layers of a high voltage silicon vertical multi junction (VMJ) photovoltaic cell, to provide a barrier that protects the active layers thereof. While the exemplary method is illustrated and described herein as a series of blocks representative of various events and/or acts, the subject innovation is not limited by the illustrated ordering of such blocks. For instance, some acts or events may occur in different orders and/or concurrently with other acts or events, apart from the ordering illustrated herein, in accordance with the innovation. In addition, not all illustrated blocks, events or acts, may be required to implement a methodology in accordance with the subject innovation. Moreover, it will be appreciated that the exemplary method and other methods according to the innovation may be implemented in association with the method illustrated and described herein, as well as in association with other systems and apparatus not illustrated or described. Initially, and at 410 multiple cell units with PN junctions are formed as described in detail supra. As explained earlier each cell unit itself can include a plurality of parallel semiconductor substrates that are stacked together. Each layer can consist of impurity doped semiconductor material that form a PN junction, and further include a "built-in" electrostatic drift field that enhance minority carrier movement toward such PN junction. Subsequently and at 420, a plurality of such cell units are integrated to shape a VMJ. Next and at 430 a buffer zone can be implemented that contacts end layers of the VMJ, to provide a barrier that protects the active layers thereof. Such buffer zone(s) can be in form of an inactive layer(s) arrangement that is additionally stacked upon and/or below end layers of the VMJ cell. The VMJ can then be implemented as part of a photovoltaic cell.

Figure 5:
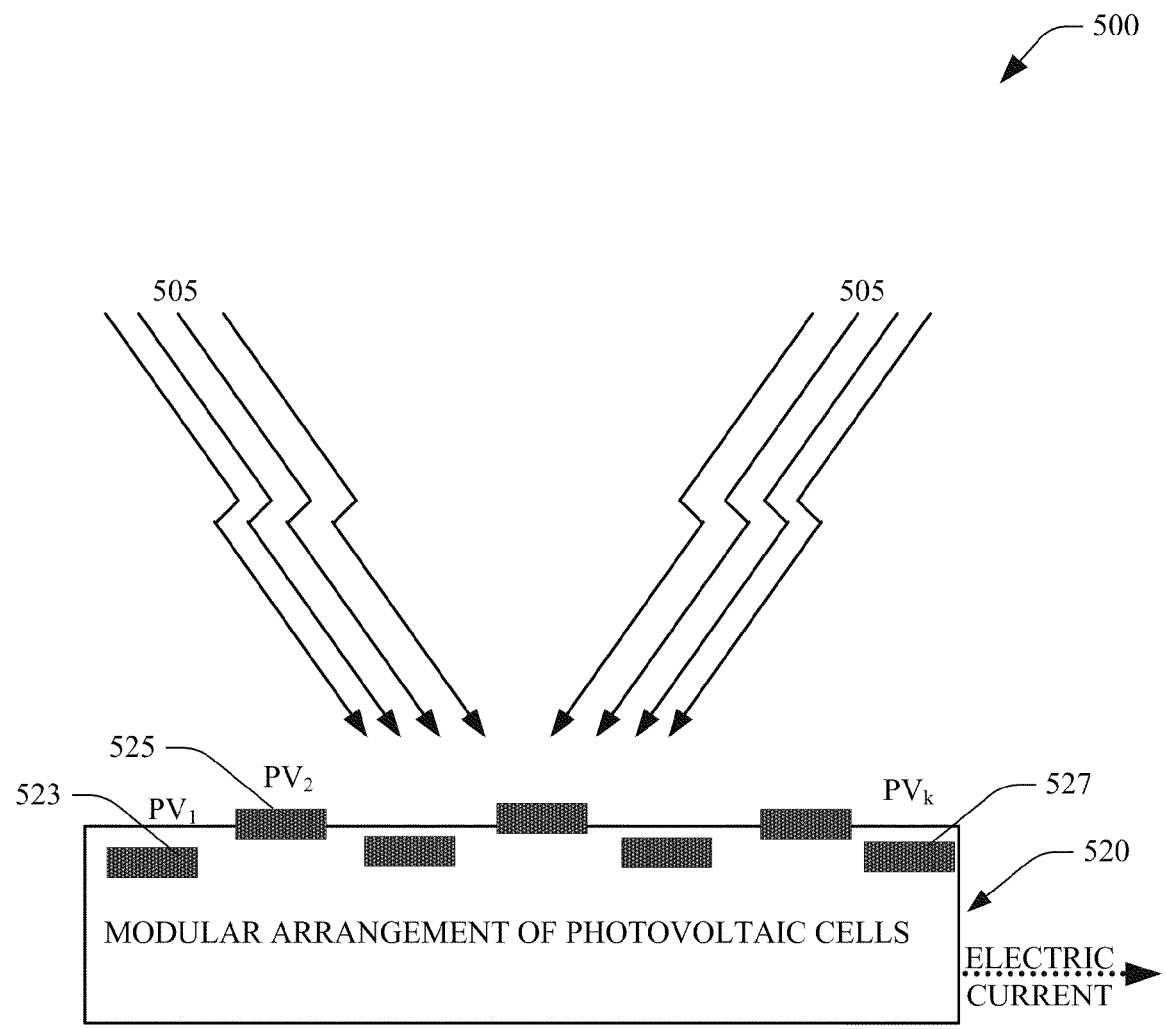
FIG. 5 illustrates a schematic cross sectional view for a solar assembly that includes a modular arrangement of photovoltaic (PV) cells, which can implement VMJs with buffer zones.

FIG. 5 illustrates a schematic cross sectional view 500 for a solar assembly that includes a modular arrangement 520 of photovoltaic (PV) cells 523, 525, 527 (1 through k, where k is an integer). Each PV cell can employ a plurality of VMJs with buffer zones according to an aspect of the subject innovation. Typically, each of the PV cells (also referred to as photovoltaic cells) 523, 525, 527 can convert light (e.g., sunlight) into electrical energy. The modular arrangement 520 of the PV cells can include standardized units or segment that facilitate construction and provide for a flexible arrangement.

In one exemplary aspect, each of the photovoltaic cells 523, 525, 527 can be a dye-sensitized solar cell (DSC) that includes a plurality of glass substrates (not shown), wherein deposited thereon are transparent conducting coating, such as a layer of fluorine-doped tin oxide, for example. Such DSC can further include a semiconductor layer such as $TiO_2$ particles, a sensitizing dye layer, an electrolyte and a catalyst layer such as Pt—(not shown)—which can be sandwiched between the glass substrates. A semiconductor layer can further be deposited on the coating of the glass substrate, and the dye layer can be sorbed on the semiconductor layer as a monolayer, for example. Hence, an electrode and a counter electrode can be formed with a redox mediator to control of electron flows therebetween.

Accordingly, the cells 523, 525, 527 experience cycles of excitation, oxidation, and reduction, which produce a flow of electrons, e.g., electrical energy. For example, incident light 505 excites dye molecules in the dye layer, wherein the photo excited dye molecules subsequently inject electrons into the conduction band of the semiconductor layer. Such can cause oxidation of the dye molecules, wherein the injected electrons can flow through the semiconductor layer to form an electrical current. Thereafter, the electrons reduce electrolyte at catalyst layer, and reverse the oxidized dye molecules to a neutral state. Such cycle of excitation, oxidation, and reduction can be continuously repeated to provide electrical energy.

What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims.

Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A photovoltaic cell comprising:
   a vertical multi junction (VMJ) photovoltaic cell that includes a plurality of integrally bonded cell units, each cell unit with a plurality of layers that form a PN junction(s); and
   a buffer zone attached to an end layer of the VMJ photovoltaic cell and protrudes therefrom, wherein the buffer zone at least one of safe guards the VMJ photovoltaic cell from stress and strain, and further facilitates transportation of the VMJ photovoltaic cell.

2. The photovoltaic cell of claim 1, the buffer zone including substantially low resistivity material.

3. The photovoltaic cell of claim 1, the buffer zone implementable as a rim formation on a surface of an end layer of a cell unit.

4. The photovoltaic cell of claim 1, the buffer zone sandwiched between an electrical contact and an active layer of the VMJ photovoltaic cell.

5. The photovoltaic cell of claim 4, the buffer zone with thermal expansion characteristics that substantially match thermal characteristics of the active layer.

6. The photovoltaic cell of claim 4, the buffer layer includes substantially highly doped low resistivity silicon layer.

7. The photovoltaic cell of claim 4, each cell of the cell units includes a plurality of parallel semiconductor substrates that are stacked together.

8. The photovoltaic cell of claim 7, a substrate includes impurity doped semiconductor material that form a PN junction.

9. The photovoltaic cell of claim 8, a substrate further includes a "built-in" electrostatic drift field that facilitates minority carrier movement towards the PN junction.

10. A method of protecting active layers in a VMJ photovoltaic cell comprising:
    forming a VMJ photovoltaic cell, which includes integrally bonding a plurality of cell units, each cell unit with a plurality of layers that form a PN junction(s); and
    forming a buffer zone being attached to an end layer of the VMJ photovoltaic cell and protruding therefrom, wherein the buffer zone protects the VMJ photovoltaic cell from at least one of a stress, shear, moment and torsion induced on the VMJ photovoltaic cell, the buffer zone further facilitating transportation of the VMJ photovoltaic cell.

11. The method of claim 10 further comprising selecting thermal expansion coefficients for the buffer zone to be substantially same as that of the active layers.

12. The method of claim 10 further comprising implementing Miller indices of 111 for orientation of crystal planes associated with the buffer zone.

13. The method of claim 11 further comprising forming buffer zone with substantially low resistivity as part of end layers of the VMJ cell.

14. The method of claim 11 further comprising securing the VMJ cell during coating processes via a clamp on the buffer zones.

15. The method of claim 11, the integrally bonding act further comprising stacking cell units.

16. The method of claim 11 further comprising alloying silicon wafers and aluminum interfaces to form the VMJ cell.

17. The method of claim 11 further comprising employing impurity doped semiconductor material to form PN junctions in the VMJ cell.

18. The method of claim 11 further comprising incorporating ohmic contacts between outer layers of unit cells.

19. The method of claim 11 further comprising facilitating deposition of anti coating operation by the buffer zones.

20. A photovoltaic cell comprising:
    means for forming a PN junction in a vertical multi junction (VMJ) photovoltaic cell; and
    means for buffering the VMJ photovoltaic cell against induced stress or strain, the means for buffering is attached to an end layer of the VMJ photovoltaic cell and protrudes therefrom, the means for buffering further facilitates transportation of the VMJ photovoltaic cell.

* * * * *